(12) United States Patent
Ali

(10) Patent No.: US 6,778,126 B2
(45) Date of Patent: Aug. 17, 2004

(54) STRUCTURES AND METHODS THAT IMPROVE THE LINEARITY OF ANALOG-TO-DIGITAL CONVERTERS WITH INTRODUCED NONLINEARITIES

(75) Inventor: Ahmed Mohamed Abdelatty Ali, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/302,173

(22) Filed: Nov. 21, 2002

(65) Prior Publication Data

US 2004/0100397 A1 May 27, 2004

(51) Int. Cl.[7] .............................. H03M 1/06; H03M 1/12
(52) U.S. Cl. ...................... 341/156; 341/118; 341/140
(58) Field of Search ................................ 341/156, 118, 341/140, 150, 155, 138, 139, 120, 161; 708/7

(56) References Cited

U.S. PATENT DOCUMENTS

| | | | |
|---|---|---|---|
| 4,654,815 A | * | 3/1987 | Marin et al. ................... 708/7 |
| 5,635,937 A | | 6/1997 | Lim et al. |
| 6,184,809 B1 | | 2/2001 | Yu |
| 6,259,392 B1 | * | 7/2001 | Choi et al. ................... 341/150 |
| 6,369,744 B1 | | 4/2002 | Chuang |
| 6,373,424 B1 | | 4/2002 | Soenen |
| 6,445,319 B1 | | 9/2002 | Bugeja |
| 6,545,628 B1 | * | 4/2003 | Aram ......................... 341/155 |

* cited by examiner

*Primary Examiner*—Patrick Wamsley
(74) *Attorney, Agent, or Firm*—Koppel, Jacobs, Patrick & Heybl (57) ABSTRACT

Analog-to-digital converter (ADC) structures and methods are provided that reduce an initial converter nonlinearity by introducing an inverse nonlinearity into the converter's response that is substantially the inverse of the initial converter nonlinearity. In a pipelined ADC embodiment, for example, upstream converter stages are selected that generate an upstream digital code which defines sufficient upstream code words to designate respective segments of the inverse nonlinearity. In response to each of the upstream code words, the conversion gain of the remaining downstream converter stages is then sufficiently adjusted to insert the inverse nonlinearity into the converter response.

32 Claims, 10 Drawing Sheets

STRUCTURES AND METHODS THAT IMPROVE THE LINEARITY OF ANALOG-TO-DIGITAL CONVERTERS WITH INTRODUCED NONLINEARITIES

BACKGROUND OF THE INVENTION

1. Field of the Invention

The present invention relates generally to nonlinearity in analog-to-digital converters with particular relation to pipelined analog-to-digital converters.

2. Description of the Related Art

Analog-to-digital converters (ADCs) convert analog input signals to digital output signals with a resolution that determines the number of bits in the converted signals. For example, FIG. 1 shows an exemplary pipelined ADC 20 which includes a sampler 22 that provides samples of an analog input signal $S_{in}$ and N cascaded converter stages 24 that partition the conversion of these samples to a digital code.

Each pipelined stage converts a respective analog signal to that stage's predetermined number m of digital bits and passes an amplified residue signal to a succeeding converter stage. As the succeeding converter stage converts its received residue signal in a similar manner, the preceding stage is converting a succeeding analog input signal. All converter stages, therefore, are simultaneously converting succeeding analog input signals to their respective digital bits with final converted words issuing at the same rate as the sampling rate of input analog signals.

Figure 1:
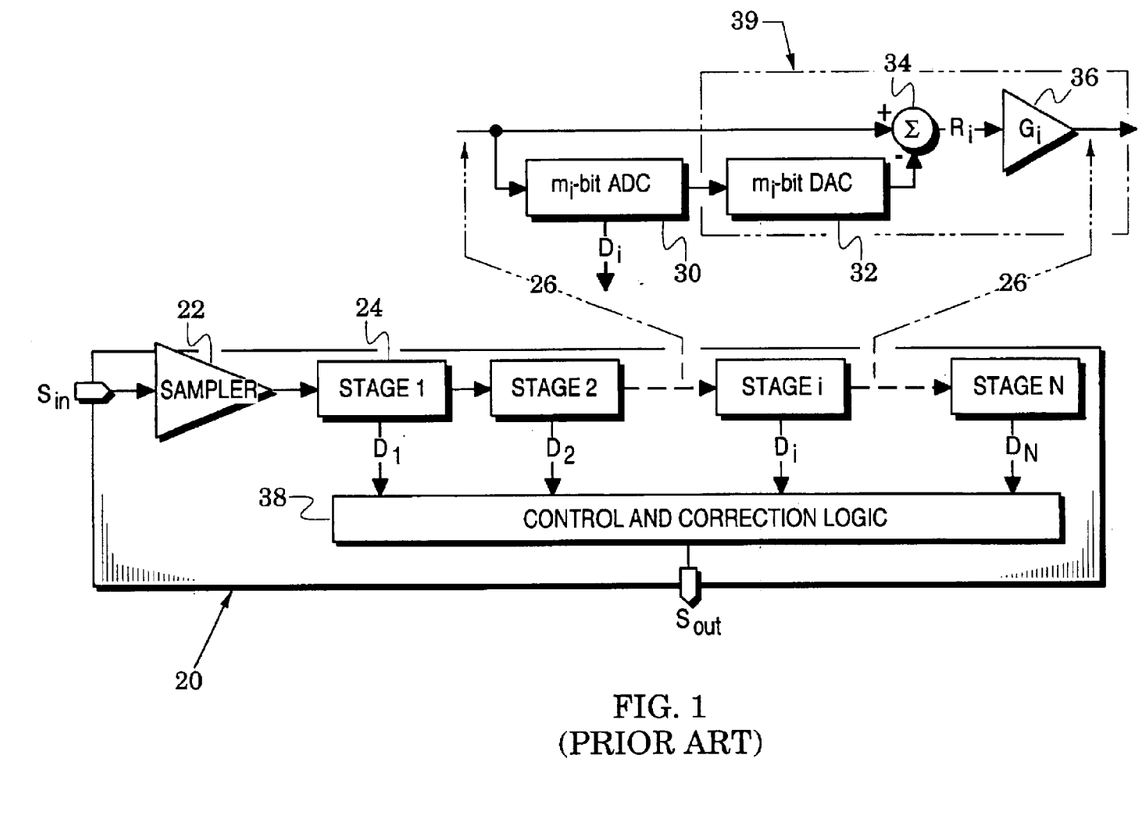
FIG. 1 is a block diagram of a conventional pipelined ADC system formed with successive converter stages.

Broken lines 26 in FIG. 1 indicate that the ith converter stage, for example, comprises an $m_i$-bit ADC 30 which provides digital bits Di and also comprises an $m_i$-bit digital-to-analog (DAC) 32 that converts these bits to an analog signal which is subtracted in a summer 34 from this stage's respective analog input to form an analog residue $R_i$ that is amplified in a respective amplifier 36 with a respective gain $G_i$ and passed to a successive converter stage.

Generally, one or more redundant bits are generated and a control and correction logic 38 includes circuits (e.g., full adders) that use the bits of succeeding stages to correct preceding-stage errors that result from various degrading effects (e.g., offset and/or gain errors) and also includes circuits (e.g., shift registers) that time-align the corresponding digital bits Especially useful embodiments of pipelined ADCs are formed with switched-capacitor structures and the high-speed, high-resolution conversion of these ADCs is used in a large number of modern electronic systems (e.g., scanners, camcorders, communications modems, medical image processors and high-definition television). It has been found, however, that various error sources (e.g., nonlinear sampler, capacitor mismatch, finite and/or nonlinear amplifier gain) degrade their conversion linearity. Accordingly, a number of calibration structures and methods have been developed to reduce this degradation.

Even with careful design and with currently-available calibration techniques, however, ADCs (and pipelined ADCs in particular) are produced in which the differential nonlinearity (DNL) is sufficiently reduced but the integral nonlinearity (INL) is excessive which causes the converter's spurious-free dynamic range (SFDR) to be less than satisfactory.

BRIEF SUMMARY OF THE INVENTION

The present invention is directed to structures and methods that reduce an initial converter nonlinearity of ADCs. These goals are realized by introducing an inverse nonlinearity into the converter's response that is substantially the inverse of the initial converter nonlinearity.

In a method embodiment, most-significant bits of the digital code are initially selected that define sufficient most-significant code words to designate respective segments of an inverse nonlinearity that is substantially the inverse of the converter nonlinearity. Subsequently, the remaining least-significant bits of the digital code are adjusted, in respective response to the most-significant code words, to sufficiently modify the conversion gain to insert the inverse nonlinearity into the converter response. The most-significant bits and least-significant bits respectively correspond to upstream converter stages and remaining downstream converter stages in pipelined embodiments of the invention.

The novel features of the invention are set forth with particularity in the appended claims. The invention will be best understood from the following description when read in conjunction with the accompanying drawings.

DETAILED DESCRIPTION OF THE INVENTION

FIGS. 3, 4A–4B and 5A–5E illustrate ADC processes and structures of the present invention that introduce inverse nonlinearities into an ADC's response to thereby reduce existing converter nonlinearities. Although the teachings of the invention apply to all ADCs, their description is enhanced with an initial investigation of the exemplary pipelined ADC structures of FIGS. 2A–2C. Attention will then be subsequently redirected to FIGS. 3, 4A–4B and 5A–5E.

The background description of a pipelined ADC (20 in FIG. 1) included an exemplary converter stage (stage i in FIG. 1) that converts a respective analog signal to m bits of a digital code and consists of an m-bit ADC (30 in FIG. 1) in association with an m-bit DAC, a summer and an amplifier (32, 34 and 36 in FIG. 1) which provide an amplified (i.e., multiplied) residue signal to a succeeding converter stage. The latter elements are grouped within a broken-line box 39 in FIG. 1 to indicate that they are generally referred to as a multiplying digital-to-analog converter (MDAC).

Figure 2A:
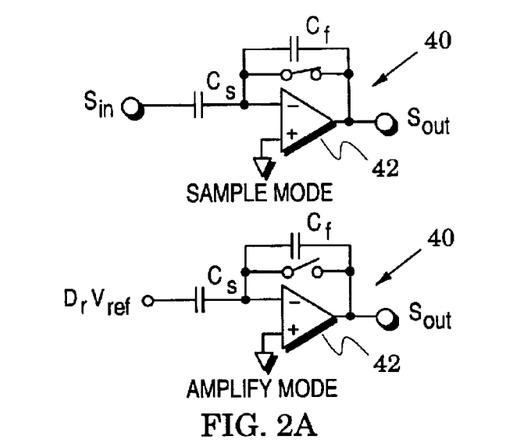
FIGS. 2A and 2B are schematics of different multiplying digital-to-analog converter (MDAC) embodiments that are each shown in a sample mode and an amplify mode.
Figure 2B:
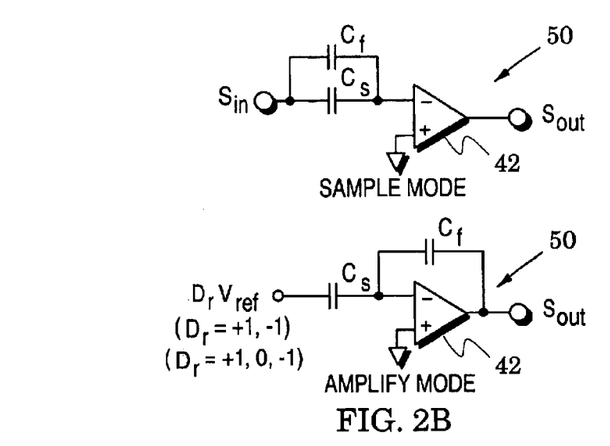

FIGS. 2A and 2B illustrate switched-capacitor embodiments of the MDAC 39 that are often used in pipelined ADCs. The MDAC 40 of FIG. 2A, for example, includes a differential amplifier 42, a feedback capacitor $C_f$ that couples the output of the differential amplifier to its noninverting input and a sample capacitor $C_s$ that is coupled to the noninverting input and arranged to receive a respective input signal $S_{in}$ when the MDAC is in a sample mode. In this mode, therefore, the sample capacitor $C_s$ receives an electrical charge proportional to its capacitance and to the input signal $S_{in}$. In the sample mode, a switch generally shorts the feedback capacitor $C_f$ to eliminate any stored charge.

FIG. 2A also shows an amplify mode in which the electrical charge received by the sample capacitor $C_s$ in the sample mode is transferred to the feedback capacitor $C_f$ (whose corresponding switch is now open). This transfer is accomplished by coupling the input plate of the sample capacitor to $D_r V_{ref}$ wherein reference voltages $-V_{ref}$ and $+V_{ref}$ define the lower and upper bounds of the analog input signal $S_{in}$ and $D_r$ is a digital representation that is established by the decisions of the preceding stage's ADC. The amplification $S_{out}/S_{in}$ that results from the transfer of the electrical charge is the ratio $C_s/C_f$.

FIG. 2B illustrates an MDAC 50 that generally enhances accuracy and bandwidth. The MDAC 50 includes elements of the MDAC 40 with like elements indicated by like reference numbers but it differs from the MDAC 40 because the feedback capacitor $C_f$ is arranged to also receive the respective input signal $S_{in}$ in the sample mode. Therefore, both of the sample capacitor $C_s$ and the feedback capacitor $C_f$ receive an electrical charge in the sample mode.

In the amplify mode, the electrical charge received by the sample capacitor $C_s$ is again transferred to the feedback capacitor $C_f$. Because this charge joins the charge already stored in the feedback capacitor $C_f$, the amplification $S_{out}/S_{in}$ of the MDAC 50 is the ratio $(C_f+C_s)/C_f$. In an MDAC embodiment in which $C_f=C_s$, the MDAC 50 therefore has a gain of two.

Although the MDAC 50 of FIG. 2B is shown as a single-ended structure for simplicity of illustration and description, it is generally realized as a differential structure in which the digital representation $D_r$ takes on values of $-1$ and $+1$ when the MDAC 50 is part of a 1-bit converter stage and values of $-1$, 0 and $+1$ when it is part of a 1.5-bit converter stage.

Figure 2C:
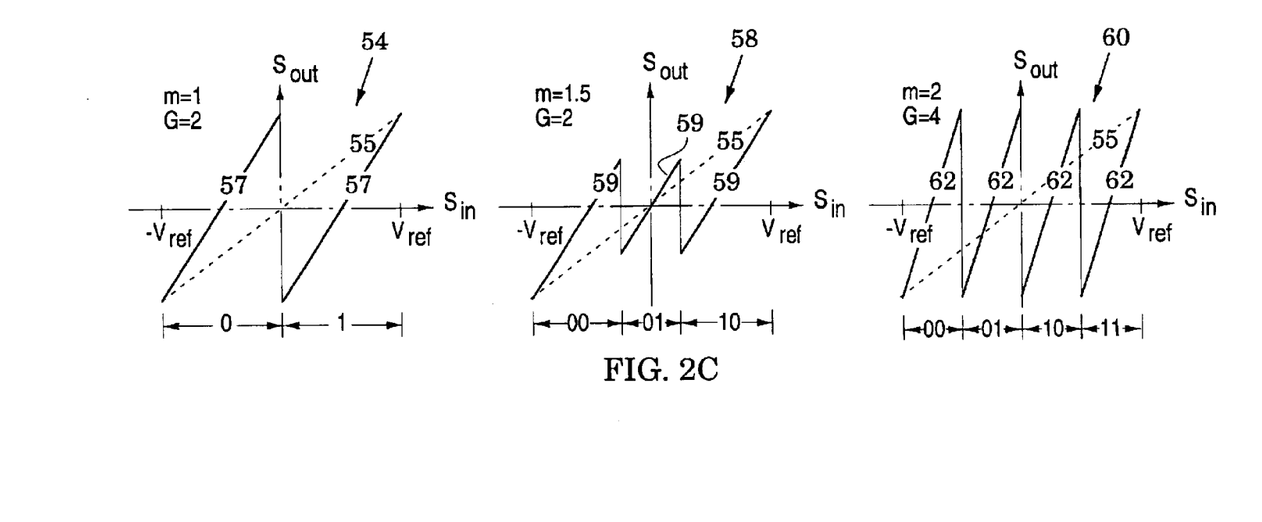
FIG. 2C shows graphs that illustrate responses of 1-bit and 1.5-bit versions of the MDAC embodiment of FIG. 2B and of a 2-bit MDAC version of a similar embodiment.

In the graph 54 of FIG. 2C, for example, it is assumed that the MDAC 50 is in a 1-bit converter stage. The corresponding ADC (e.g., the ADC 30 of FIG. 1) receives an input signal $S_{in}$ represented by the broken line 55 and compares this signal to ground. When the input signal is below ground in the left side of the graph 54, the 1-bit ADC generates a bit with the value 0 and sets $D_r$ in FIG. 2B to $+1$. When the input signal is above ground in the left side of the graph 54, the 1-bit ADC generates a bit with the value 1 and sets $D_r$ to $-1$.

Accordingly, the output of the MDAC 50 is represented in the graph 54 by response lines 57 that have twice the slope of the broken line 55 but which are shifted up in the left side of the graph 54 and shifted down in the right side. A residue signal represented by the response lines 57 is thus sent to a succeeding converter stage. As shown at the upper left of the graph 54, this embodiment of the MDAC 50 is associated with a 1-bit (m=1) converter stage and has a gain of 2.

In the graph 58 of FIG. 2C, it is assumed that the MDAC 50 is in a 1.5-bit converter stage. The corresponding ADC now compares the input s signal $S_{in}$ to $-V_{ref}/4$ and $+V_{ref}/4$ in two corresponding comparators. When the input signal is below $-V_{ref}/4$ in the left side of the graph 54, the 1.5-bit ADC generates two bits with the value 00 and sets $D_r$ in FIG. 2B to $+1$. When the input signal is between $-V_{ref}/4$ and $+V_{ref}/4$, the 1.5-bit ADC generates two bits with the value 01 and sets $D_r$ to 0. When the input signal is above $+V_{ref}/4$ in the right side of the graph 54, the 1.5-bit ADC generates two bits with the value 10 and sets sets $D_r$ to $-1$.

The resulting output of the MDAC 50 is represented in the graph 58 by response lines 59 that have twice the slope of the broken line 55 but which are shifted up and down in the left and right sides of the graph 58 and are not shifted in the center of the graph. As shown at the upper left of the graph 58, this embodiment of the MDAC 50 is associated with a 1.5-bit (m=1.5) converter stage and has a gain of 2.

Additional MDAC embodiments can be formed by having the associated ADC convert additional bits and by adding, for example, additional sample capacitors to receive the respective input signal along with the feedback capacitor. Thus, the gain can be further increased to correspond to the additional bits and to facilitate decisions by the downstream converter stage.

For example, the associated ADC can be a 2-bit converter that makes decisions at $-V_{ref}/2$ GND and $+V_{ref}/2$ and the additional sample capacitors receive variations of the digital representation $D_r$ in the amplify mode. The output of a 2-bit MDAC is shown in the graph 60 of FIG. 2C to be defined by four response lines 62 that have four times the slope of the broken line 55 and which are shifted up in the left side of the graph by $+2V_{ref}$ and $+V_{ref}$ and shifted shifted down in the right side of the graph by $-V_{ref}$ and $-2V_{ref}$. Corresponding to these regions, the associated 2-bit ADC generates two bits with the values 00, 01, 10 and 11. As shown at the upper left of the graph 60, this embodiment of the MDAC 50 is associated with a 2-bit (m=2) converter stage and has a gain of 4.

Figure 3:
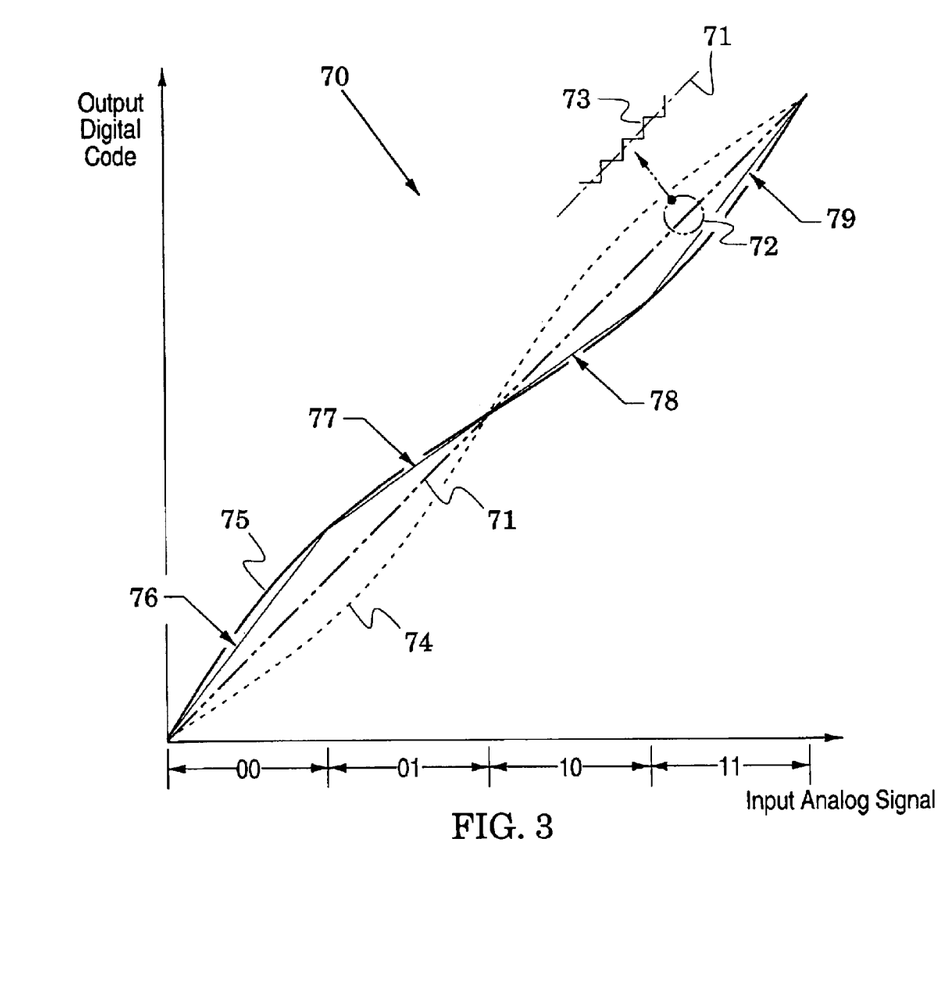
FIG. 3 is a graph of converter responses of a pipelined ADC that shows converter nonlinearity and an inverse nonlinearity of the present invention that is substantially the inverse of the converter nonlinearity.

Having introduced related MDAC structures, attention is now directed to the graph 70 of FIG. 3 which illustrates an exemplary response of a pipelined ADC. It is desired, of course, that the ADC be perfectly linear in which case its response would be the linear broken line 71. An area 72 of the response 71 is substantially magnified to shown that the output digital code of the pipelined ADC actually defines steps 73 that are centered about the linear response 71.

Unfortunately, real pipelined ADCs do not achieve the linear response 71 but rather, exhibit various nonlinear responses which are exemplified in the graph 70 by the greatly-exaggerated nonlinear converter response 74. In accordance with the present invention, the nonlinear converter response will be substantially reduced by introduction of a corresponding inverse nonlinearity.

As an example of inverse nonlinearity, assume a pipelined ADC's response does not have a linear response $F(x)=x$ but is degraded by a cubic nonlinearity so that its actual response is $F(x)=x-ax^3=x(1-ax^2)$ wherein a is generally a number significantly less than 1. The inverse (or opposite) of the cubic nonlinearity can be expressed as approximately $1/(1-ax^2)$ wherein an inverse response would then be $G(x)=x/(1-ax^2)$ or $G(x)=x+ax^3$ (with the use of Taylor expansions).

In accordance with the present invention, the inverse response and the converter response are cascaded to form a cascaded response $$H(x)=G(F(x))=(x-ax^3)+a(x-ax^3)^3=(x-ax^3)+ax^3-3a^2x^5+3a^3x^7-a^4x^9= x-3a^2x^5+3a^3x^7-a^4x^9. \quad (1)$$

Because a is significantly less than 1, the three degrading terms of equation (1) are substantially less than the degrading cubic nonlinearity $ax^3$ and the nonlinearity of the cascaded response has therefore been significantly reduced.

These linearizing concepts of the invention are applied in FIG. 3 by introducing the inverse response 75 which is the inverse of the nonlinear converter response 74. It is noted that this inverse response can be approximated by straight-line segments 76, 77, 78 and 79 and that these segments correspond to values 00, 01, 10 and 11 of the two most-significant bits (MSBs) in the digital code of the pipelined ADC.

The invention recognizes that the most-significant bits are generated by upstream converter stages and that the conversion response of each of the segments 76, 77, 78 and 79 can be realized by sufficiently adjusting the conversion gain of the remaining least-significant bits (LSBs) of the remaining downstream converter stages. Accordingly, the inverse nonlinearity will be inserted into the converter response to thereby reduce the converter nonlinearity.

Figure 4A:
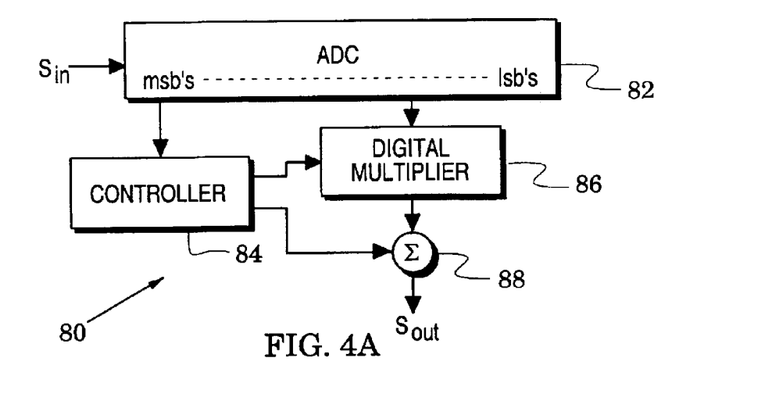
FIGS. 4A and 4B are block diagrams of ADC embodiments of the present invention which facilitate the introduction of nonlinearities that significantly improve converter linearity.

Although these concepts have been derived with reference to upstream and downstream converter stages, they may be practiced with the more general ADC system 80 of FIG. 4A which reduces converter nonlinearity in its converter response. In particular, the system includes an ADC 82, a controller, 84, a digital multiplier 86 and a digital adder 88. The ADC 82 converts an analog signal $S_{in}$ to a digital code (symbolized in FIG. 4A by MSBs that extend to LSBs) with a conversion gain that produces the converter nonlinearity and the digital multiplier 86 processes the digital code to realize a digital output signal $S_{out}$.

In accordance with the invention, the digital controller 84 receives MSBs of the digital code that define sufficient most-significant code words to designate respective segments (76, 77, 78 and 79 in FIG. 3) of an inverse nonlinearity (75 in FIG. 3) that is substantially the inverse of the converter nonlinearity (74 in FIG. 3) and that, in response, multiplies the remaining LSBs of the digital code by digital multipliers which sufficiently modify the conversion gain to insert the inverse nonlinearity into the converter response. Although this multiplication is sufficient, it is noted that the digital controller 84 may additionally multiply all bits of the digital code in other embodiments of the invention.

Although this insertion process is especially suited for reducing integral nonlinearity (INL) of ADCs, it may introduce offsets that degrade a converter's differential nonlinearity (DNL). For example, it may be found, after completion of the insertion process, that segments 78 and 79 in FIG. 3 have been offset relative to response segments 76 and 77. Accordingly, the digital adder 88 is arranged in series with the digital multiplier 86 and the controller 84 can respond to selected ones of the most-significant code words (e.g., 10 and 11 in FIG. 3) and command the adder 88 to sum digital offset words with the LSBs to thereby reduce any discontinuities introduced into the converter response by the multiplier.

Figure 4B:
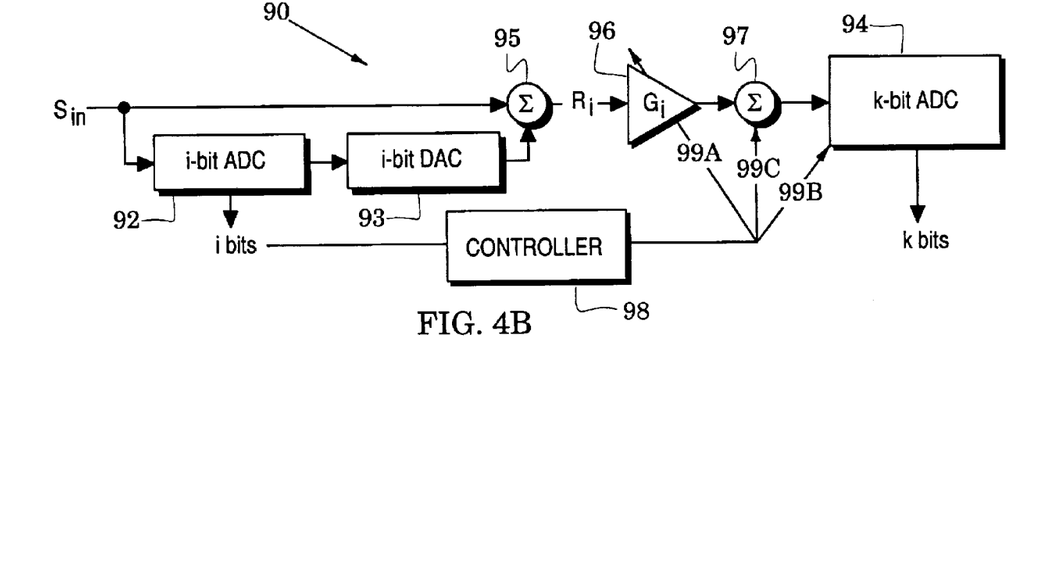

FIG. 4B illustrates another ADC system 90 in which i upstream converter stages comprise an i-bit ADC 92 with a corresponding i-bit DAC 93 and the remaining downstream converter stages comprise a k-bit ADC 94. Similar to the description above that referred to the MDAC 39 of FIG. 1, the i-bit ADC 92 converts an analog input signal $S_{in}$ into i bits of a digital code. The i-bit DAC 93 responds to the i bits by converting them to an analog signal which is subtracted in a summer 95 from the analog input signal $S_{in}$ to form an analog residue $R_i$ that is amplified by the gain $G_i$ of a residue amplifier 96. The amplified residue signal is then converted to the remaining k-bits of the digital code.

In the system 90, a summer 97 is arranged between the amplifier and the k-bit ADC 94 and a controller 98 exercises control over the amplifier 96, the summer 97 and the k-bit ADC 94 in response to the i bits of the digital code. In accordance with the invention, the upstream i bits define sufficient upstream code words to designate respective segments (76, 77, 78 and 79 in FIG. 3) of an inverse nonlinearity (75 in FIG. 3) that is substantially the inverse of the converter nonlinearity (74 in FIG. 3).

In response to each of the upstream code words, the controller 98 makes a respective change (indicated by a connecting arrow 99A) in the gain of the residue amplifier 96 to thereby modify the conversion gain of the k-bit ADC 94 so as to insert the inverse nonlinearity into the converter response. Alternatively, the controller 98 responds to each of the upstream code words by altering (indicated by another connecting arrow 99B) the amplifying charges in switched-capacitor MDACS in the remaining downstream converter stages of the k-bit ADC 94 to thereby change the full-scale range of the downstream stages.

When necessary to remove an introduced discontinuity between response segments, the controller 98 responds to selected ones of the upstream code words by inserting (indicated by another connecting arrow 99C) an offset signal into the summer 97 to thereby reduce any discontinuities introduced into the converter response by the altering step.

The ADC systems 80 and 90 of FIGS. 4A and 4B have respectively introduced digital and analog embodiments of the invention which are now investigated in greater detail in FIGS. 5A–5F.

Figure 5A:
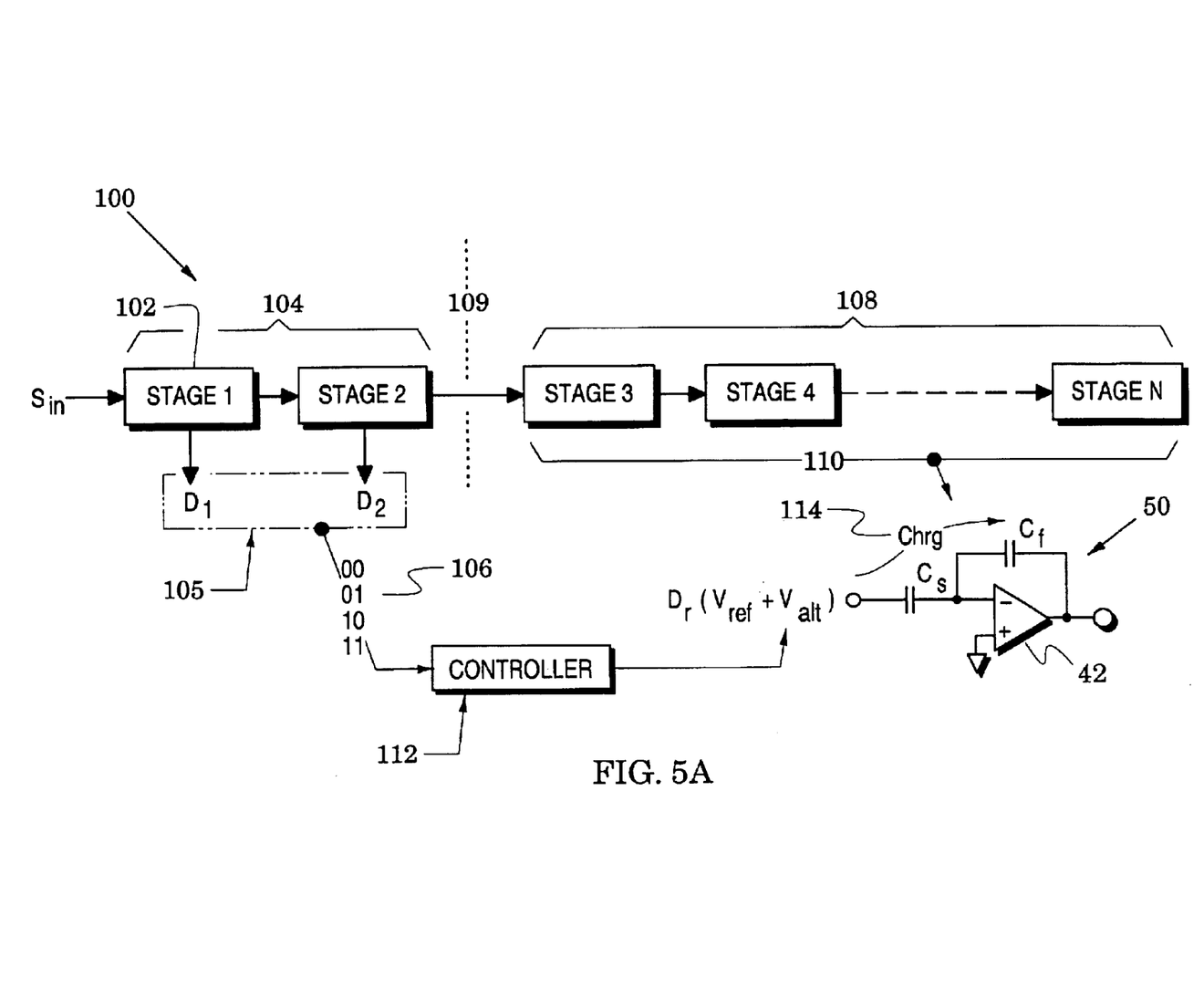
FIGS. 5A–5F are block diagrams of pipelined ADC embodiments of the present invention that also significantly improve converter linearity.

FIG. 5A, in particular, illustrates a pipelined ADC 100 that includes a plurality of successive converter stages 102 which convert an analog input signal $S_{in}$ into a digital code in a conversion process that progresses from upstream converter stages to downstream converter stages. Because of various imperfections, it is assumed that this process produces a conversion response with a conversion nonlinearity (e.g., the nonlinearity 74 of FIG. 3).

In a first process of the invention, upstream converter stages are initially selected that generate an upstream digital code which defines sufficient upstream code words to designate respective segments of an inverse nonlinearity that is substantially the inverse of the converter nonlinearity. For illustrative purposes, it is assumed that the converter stages 102 are 1-bit stages so that stages 1 and 2 can be selected to be the upstream converter stages 104 that provide an upstream digital code 105 which has 00, 01, 10 and 11 as its upstream code words 106. These code words are sufficient to designate the straight-line segments (76, 77, 78 and 79 in FIG. 3) which constitute an inverse nonlinearity that is substantially the inverse of the converter nonlinearity (i.e., the nonlinear response 74 of FIG. 3).

It is further recognized that the conversion gain of the remaining downstream converter stages can be adjusted, in response to each of the upstream code words, by altering the amplifying charge in the remaining downstream converter stages to thereby change the full-scale range of the downstream stages. Essentially, this alters the residue signal that the upstream converter stages provide to the downstream converter stages.

Because stages 1 and 2 have been selected to be the upstream converter stages 104 in this example, stage 3 through stage N are therefore the remaining downstream converter stages 108 as emphasized by the broken vertical line 109 which separates upstream converter stages from remaining downstream converter stages. Altering the amplifying charge in the downstream converter stages changes the conversion gain of these stages to thereby realize the altered gain of each of the segments 76, 77, 78 and 79 of FIG. 3.

The amplifying charges can be altered in various processes and with various structures. To illustrate one embodiment, FIG. 5A shows, with bracket 110, that each of the downstream converter stages 108 includes the MDAC 50 of FIG. 2B in its 1-bit configuration for which the digital representation $D_r$ has values of −1 and +1. Preferably, the feedback capacitor $C_f$ and the sample capacitor $C_s$ are configured with equal capacitances. In addition, the reference voltage $V_{ref}$ has been supplemented by an altering voltage $V_{alt}$ which is provided by a controller 112 that responds to the upstream code words 106 (i.e., the reference voltage $V_{ref}$ has been altered to an altered value by the altering voltage $V_{alt}$).

When the upstream code words 106 have the value 00, for example, the controller 112 sets the altering voltage $V_{alt}$ to slightly decrease the sum of $V_{ref}+V_{alt}$. Because the transferred charge 114 is thereby increased in each MDAC 50 in each of the downstream converter stages 108, the increased response slope of segment 76 is realized in the graph 70 of FIG. 3. Corresponding values of the altering voltage $V_{alt}$ are then provided by the controller 112 in response to each of the other upstream code words 106 to realize the response slopes of the other segments 77, 78 and 79. Because the response segments 76 and 79 of FIG. 3 have approximately a single conversion slope and the response segments 77 and 78 approximate the same conversion slope but with opposite sign, it is noted that the controller 112 may only need to provide a single value for the altering voltage $V_{alt}$ and appropriately switch signs of this value.

Figure 5B:
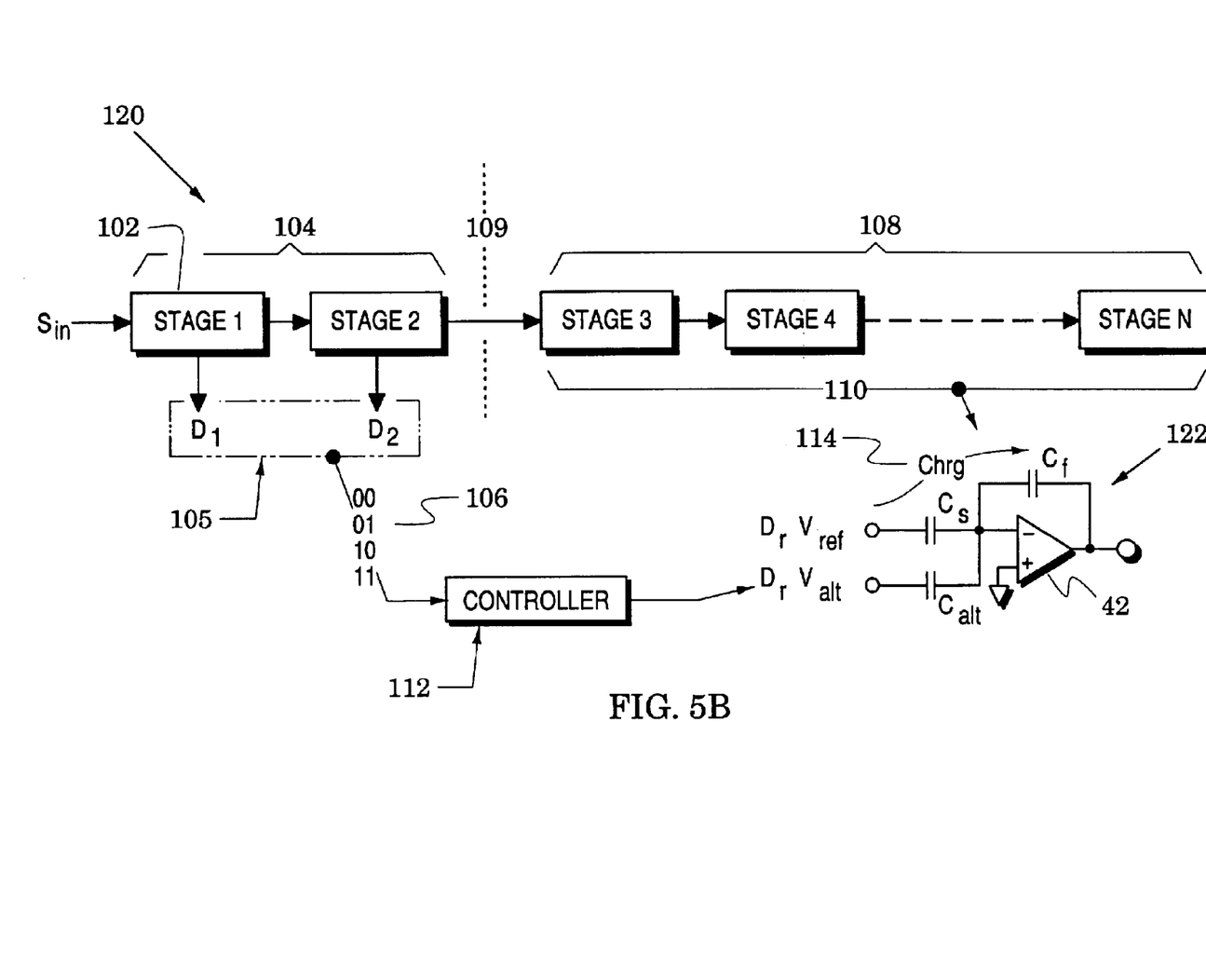

FIG. 5B illustrates another pipelined ADC 120 that includes elements of the pipelined ADC 100 of FIG. 5A with like elements indicated by like reference numbers. The MDAC 50 of the pipelined ADC 100 has, however, been revised to an MDAC 122 that has an altering capacitor $C_{alt}$ coupled to the feedback capacitor $C_f$. In addition, the sample capacitor $C_s$ receives $D_r V_{ref}$ in the amplify mode rather than $D_r(V_{ref}+V_{alt})$ as it did in the pipelined ADC 100.

The altering capacitor $C_{alt}$ is not coupled to receive the stage's respective input signal $S_{in}$ during the sample mode but is coupled to receive the altering voltage $D_r V_{alt}$ during the amplify mode. The amplifying charge is thus altered by charges that are transferred via the added altering capacitor $C_{alt}$ rather than by altering the voltage applied to the sample capacitor $C_s$ as was done in the pipelined ADC 100 of FIG. 5A. Although the altering capacitor $C_{alt}$ may have the same capacitance as the sample capacitor $C_s$, other capacitance values may be used with corresponding selections of $V_{alt}$ that realize the desired alteration of amplifying charges.

The methods and structures described above alter the reference voltage $V_{ref}$ in the MDACs of the downstream converter stages. In addition to their MDACs, each of these stages also includes a corresponding ADC which makes conversion decisions with comparators. If those comparators make decisions based on the reference voltage $V_{ref}$ (e.g., as in 1.5-bit converter stages), the above processes may introduce conversion errors that cannot be corrected with the redundancy that is incorporated in typical pipelined ADCs (corrected, for example, by the control and correction logic 38 of FIG. 1).

In the response of a 1.5-bit MDAC that is shown in FIG. 2C, for example, the transitions between the code words 00, 01 and 10 are set by comparators that compare the input analog signal to $-V_{ref}/4$ and $+V_{ref}/4$. Accordingly, the controller 112 of FIGS. 5A and 5B should also alter these comparator voltages (e.g., to $-(V_{ref}+V_{alt})/4$ and $+(V_{ref}+V_{alt})/4$).

For descriptive clarity, converter stage 2 of FIG. 5A can be referred to as the immediate upstream converter stage that immediately precedes the downstream converter stages 108. The invention further recognizes that the conversion gain of the remaining downstream converter stages can be adjusted, in response to each of the upstream code words, by altering the gain of the immediate upstream converter stage. Essentially, this alters the residue signal that the upstream converter stages provide to the downstream converter stages.

Figure 5C:
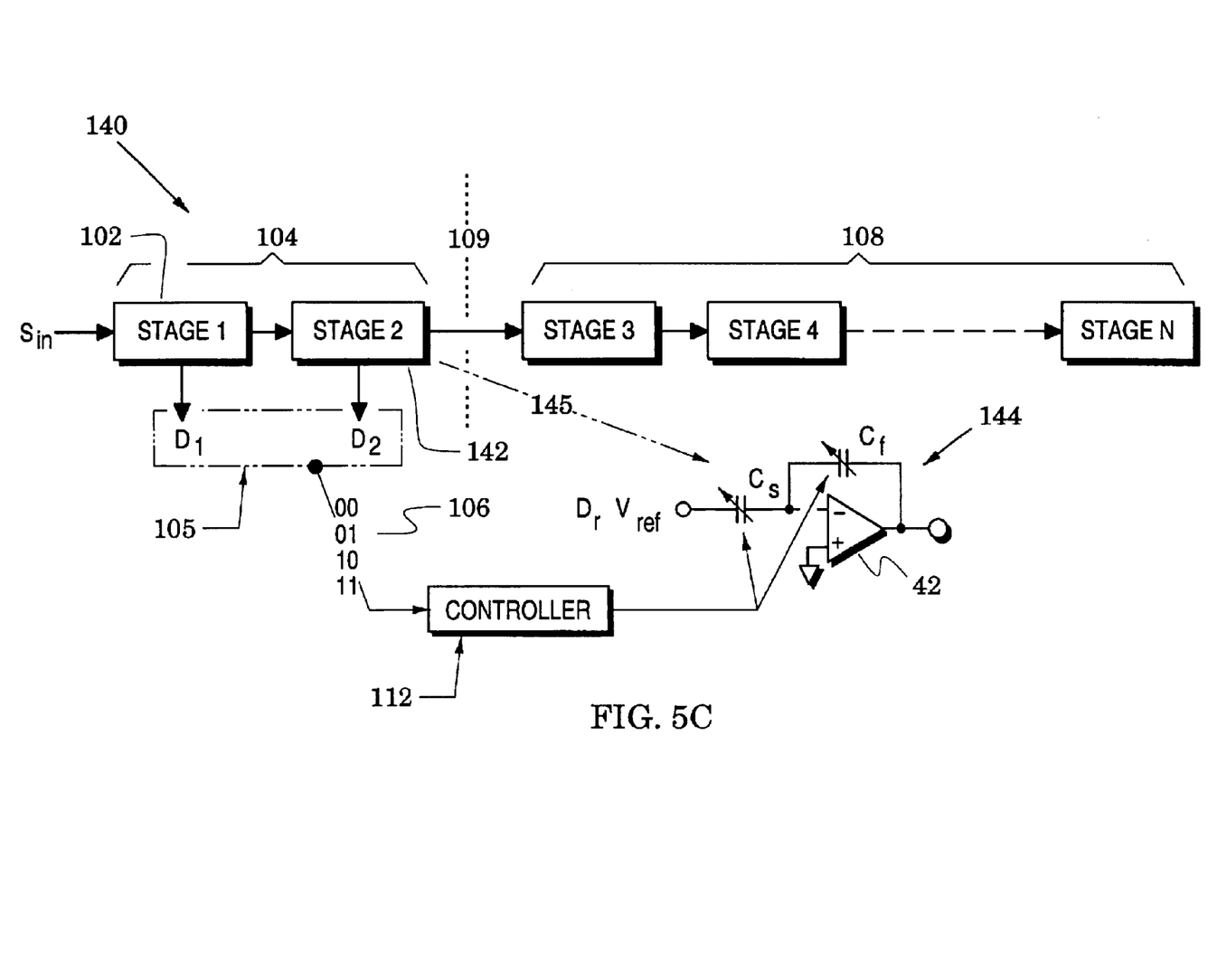

This process is illustrated in the pipelined ADC 140 of FIG. 5C that includes elements of the pipelined ADC 100 of FIG. 5A with like elements indicated by like reference numbers. In FIG. 5C, converter stage 2 is indicated as the immediate upstream converter stage 142 which includes an MDAC 144 as indicated by inclusion arrow 145.

The MDAC 144 is similar to the MDAC 50 of FIG. 2A except the capacitance of at least one of the feedback capacitor $C_f$ and the sample capacitor $C_s$ can be altered (as indicated by slanted arrows across the capacitors) by the controller 112 in response to the upstream code words 106. Also, the altering voltage $V_{alt}$ has been removed so that only the reference voltage $V_{ref}$ is applied to the sample capacitor $C_s$ in the amplify mode.

In response to the code word 00 the controller 112 can decrease the feedback capacitor $C_f$ to thereby increase the gain of the MDAC 144 in the immediate upstream converter stage 142 and thus realize the increased slope of segment 76 in FIG. 3. The controller can then alter the feedback capacitor $C_f$ appropriately in response to each of the other code words to realize the slopes of the other segments.

These concepts of the invention may be practiced with various structures. For example, the feedback capacitor $C_f$ and the sample capacitor $C_s$ may be realized as the sum of unit capacitors and altered by coupling or decoupling unit capacitors from this sum. This coupling and decoupling may be accomplished, for example, with coupling transistors that respond to the controller 112.

As previously stated, the linearizing processes and structures of the invention are especially suited for reducing the INL of pipelined ADCs but they may introduce DNL. A previous example was given in which the linearizing methods introduce an offset such that a discontinuity appears between response segments 77 and 78 and response segments 76 and 77. Accordingly, another process of the invention modifies, in response to selected ones of the upstream code words, the amplifying charge in the immediate upstream converter stage (142 in FIG. 5C) to thereby reduce any discontinuities introduced into the converter response by the altering steps described with respect to FIGS. 5A through 5C.

Figure 5D:
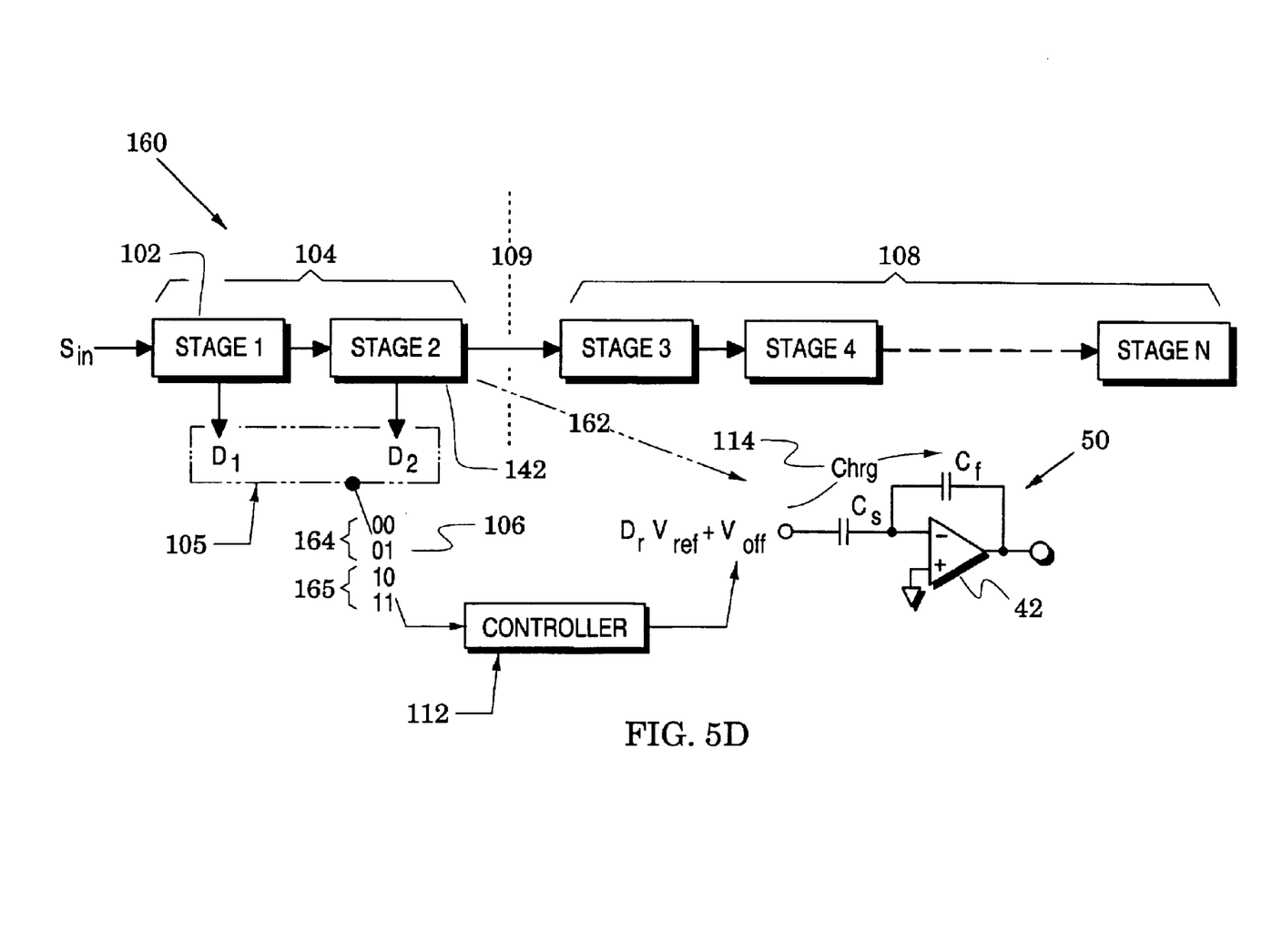

In particular, FIG. 5D illustrates a pipelined ADC 160 that is similar to the pipelined ADC 140 of FIG. 5C with like elements indicated by like reference numbers. FIG. 5D indicates that the immediate upstream converter stage 142 includes the MDAC 50 of FIG. 5A as indicated by inclusion arrow 162. However, the upstream code words are indicated by brackets 164 and 165 to be in two groups wherein the first group comprises words 00 and 01 and the second group comprises words 10 and 11.

In operation of the pipelined ADC 160, the controller 112 modifies the reference voltage $V_{ref}$ with an offset voltage $V_{off}$ for the code words corresponding to one of the brackets 164 and 165 but not for the code words corresponding to the other of the brackets. For example, the controller 112 may apply the offset voltage $V_{off}$ only in response to the code words 10 and 11 corresponding to bracket 165. It is noted that the offset voltage $V_{off}$ is never added alone but is only added to correct segment discontinuities introduced when the slopes of the segments have been altered as illustrated in FIGS. 5A–5C.

Figure 5E:
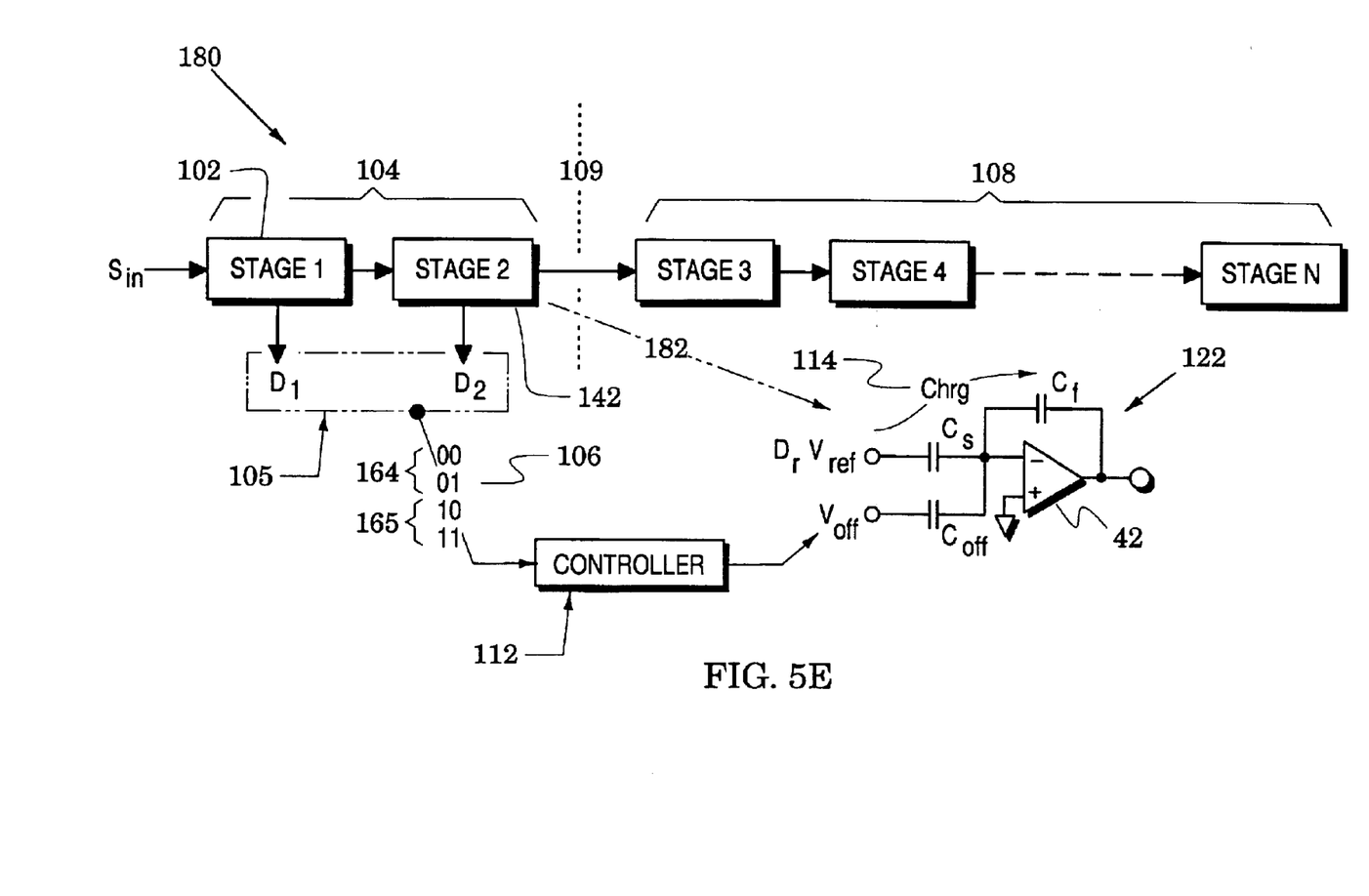

FIG. 5E illustrates another pipelined ADC 180 that is similar to the pipelined ADC 160 of FIG. 5D with like elements indicated by like reference numbers. The immediate upstream converter stage 142, however, includes the MDAC 50 of FIG. 5A as indicated by inclusion arrow 182. In addition, the altering voltage $V_{alt}$ has been replaced by an offset voltage $V_{off}$ and, for the sake of terminology, the altering capacitor $C_{alt}$ has been replaced with an offset capacitor $C_{off}$. As was done in FIG. 5D, the upstream code words have been indicated by brackets 164 and 165 to be in two groups wherein the first group comprises words 00 and 01 and the second group comprises words 10 and 11. Although the offset capacitor $C_{off}$ may have the same capacitance as the sample capacitor $C_s$, other capacitance values may be used with corresponding selections of $V_{off}$ that realize the desired modification of amplifying charges.

The operation of the pipelined ADC 180 is similar to that of the pipelined ADC 160 except the controller 112 applies the offset voltage $V_{off}$ to the offset capacitor $C_{off}$ rather than modifying the reference voltage $V_{ref}$. The controller would apply the offset voltage $V_{off}$, for example, only in response to the code words 10 and 11 that correspond to bracket 165. It is again noted that the offset voltage $V_{off}$ is never added alone but is only added to correct segment discontinuities introduced when the slopes of the segments have been altered as illustrated in FIGS. 5A–5C.

The invention further recognizes that the conversion gain of the remaining downstream converter stages can be adjusted, in response to each of the upstream code words, by digitally multiplying the downstream bits that are associated with the downstream converter stages with appropriately selected digital multipliers. Essentially, this has the same effect as does alteration of the residue signal from the upstream converter stages.

Figure 5F:
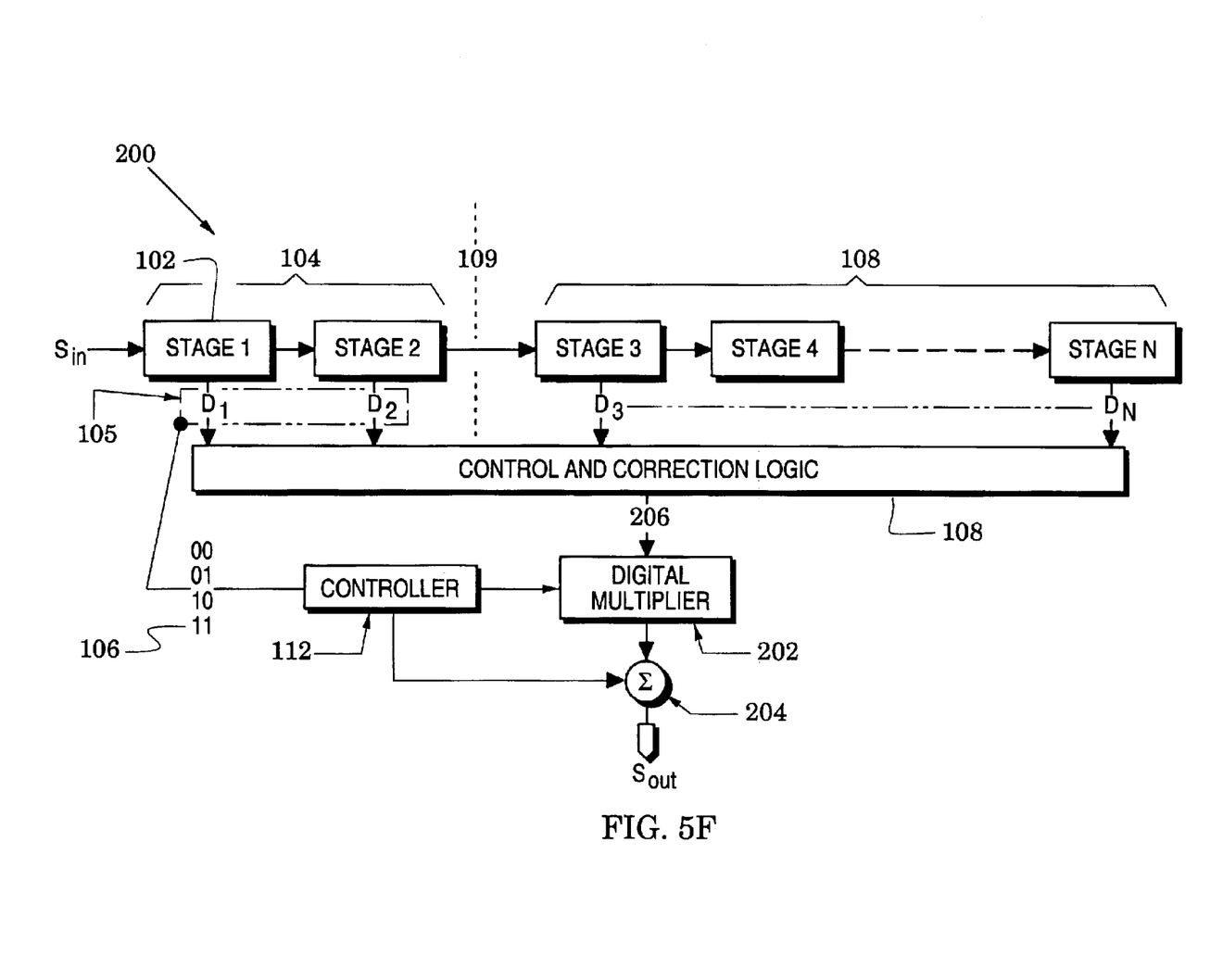

This concept is illustrated in the pipelined ADC 200 of FIG. 5F that is similar to the pipelined ADC 180 of FIG. 5E with like elements indicated by like reference numbers. The pipelined ADC 200, however, includes the control and correction logic 38 of FIG. 1 and adds a digital multiplier 202 and a digital adder 204 that further processes the digital code 206 of the control and correction logic 38.

As shown in FIG. 5F, the controller 112 receives the upstream code words 106 and, in response, commands the digital multiplier 202 to multiply the downstream bits of the digital code 204 by digital multipliers to thereby adjust the conversion gain of the respective linear segments 76, 77, 78 and 79 in FIG. 3. Although this multiplication is sufficient, it is noted that the controller 112 may additionally multiply all bits of the digital code in other embodiments of the invention.

If this adjustment of conversion gain introduces discontinuities between any of the segments, the controller 112 responds to selected ones of the upstream code words and commands the adder 204 to add digital offset words to the downstream bits to thereby reduce the discontinuities.

Various ADC process and structure embodiments have been described above. An exemplary embodiment was examined with the aid of a simulated 12-bit pipelined ADC. In particular, this ADC operates at 200 megasamples/second, has a 1-bit redundancy between its initial converter stage and the succeeding converter stages and exhibits, after conventional error correction techniques, an initial third-order converter nonlinearity. It demonstrated an initial INL of 2.5 bits and an initial spurious-free dynamic range (SFDR) of 63 dB. After an inverse nonlinearity was simulated with the processes described with respect to FIG. 5A, the exemplary pipelined ADC exhibited a significantly-improved final INL of 1 bit and a significantly-improved final SFDR of 75 dB.

It is noted that, in practice, the linearizing processes of the invention are typically preceded by various conventional techniques that measure and quantize a converter's initial converter nonlinearity. It is further noted that the controller 112 shown in FIGS. 5A–5E and the digital multiplier 202 shown in FIG. 5F may be realized with various conventional structures (e.g., digital logic elements and/or a suitably-programmed digital processor).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of reducing converter nonlinearity in the converter response of an analog-to-digital converter that converts an analog signal to a digital code with a conversion gain, the method comprising the steps of:

selecting most-significant bits of said digital code that define sufficient most-significant code words to designate respective segments of an inverse nonlinearity that is substantially the inverse of said converter nonlinearity; and     in respective response to said most-significant code words, adjusting the remaining least-significant bits of said digital code to sufficiently modify said conversion gain to insert said inverse nonlinearity into said converter response.

2. The method of claim 1, wherein said adjusting step includes the step of multiplying said remaining least-significant bits by digital multipliers that adjust said conversion gain.

3. The method of claim 2, further including the step of adding, in response to selected ones of said most-significant code words, digital offset words that reduce any discontinuities introduced into said converter response by said multiplying step.

4. A method of reducing converter nonlinearity in the converter response of an analog-to-digital converter that converts an analog signal to a digital code in a conversion process that progresses from upstream converter stages to downstream converter stages wherein each converter stage generates at least one bit of said digital code and includes a multiplying digital-to-analog converter that has a feedback capacitor and at least one sample capacitor that samples an input signal in a sample mode and transfers an amplifying charge to said feedback capacitor in an amplify mode, the method comprising the steps of:

selecting upstream converter stages that generate an upstream digital code which defines sufficient upstream code words to designate respective segments of an inverse nonlinearity that is substantially the inverse of said converter nonlinearity; and     in respective response to said upstream code words, sufficiently adjusting the conversion gain of the remaining downstream converter stages to insert said inverse nonlinearity into said converter response.

5. The method of claim 4, wherein said adjusting step includes the step of altering the amplifying charge in the remaining downstream converter stages to thereby insert said inverse nonlinearity into said converter response.

6. The method of claim 5, further including the step of modifying, in response to selected ones of said upstream code words, the amplifying charge in the immediate upstream converter stage that immediately precedes said remaining downstream converter stages to thereby reduce any discontinuities introduced into said converter response by said altering step.

7. The method of claim 6, wherein said modifying step includes the step of applying an offset voltage to the sample capacitor in said immediate upstream converter stage.

8. The method of claim 6, wherein said modifying step includes the steps of:
   paralleling said sample capacitor in said immediate upstream converter stage with at least one offset capacitor; and
   applying an offset voltage to said offset capacitor.

9. The method of claim 5, wherein said downstream converter stages include comparators that make conversion decisions with respect to a reference voltage and said altering step includes the step of supplementing said reference voltage with an altering voltage.

10. The method of claim 5, wherein said amplifying charge is transferred by a reference voltage applied to said sample capacitor and said altering step includes the step of supplementing said reference voltage with an altering voltage.

11. The method of claim 5, wherein said altering step includes the steps of:
   paralleling said sample capacitor with at least one adjusting capacitor; and
   applying an altering voltage to said altering capacitor.

12. The method of claim 4, wherein said adjusting step includes the step of altering the gain of the immediate upstream converter stage that immediately precedes the remaining downstream converter stages to thereby insert said inverse nonlinearity into said converter response.

13. The method of claim 12, further including the step of modifying, in response to selected ones of said upstream code words, the amplifying charge in said immediate upstream converter stage to thereby reduce any discontinuities introduced into said converter response by said altering step.

14. The method of claim 13, wherein said modifying step includes the step of applying an offset voltage to the sample capacitor in said immediate upstream converter stage.

15. The method of claim 13, wherein said modifying step includes the steps of:
   paralleling said sample capacitor in said immediate upstream converter stage with at least one offset capacitor; and
   applying an offset voltage to said offset capacitor.

16. The method of claim 12, wherein said altering step includes the step of changing the capacitance of at least one of said feedback capacitor and said sample capacitor.

17. The method of claim 4, wherein said downstream converter stages generate downstream bits of said digital code and said adjusting step includes the step of multiplying said downstream bits by selected digital multipliers.

18. The method of claim 17, further including the step of adding, in response to selected ones of said upstream code words, digital offset words to said downstream bits to thereby reduce any discontinuities introduced into said converter response by said multiplying step.

19. An analog-to-digital converter system that reduces converter nonlinearity in its converter response, comprising:
   an analog-to-digital converter that converts an analog signal to a digital code with a conversion gain that produces said converter nonlinearity;
   a digital multiplier that processes said digital code; and
   a digital controller that receives most-significant bits of said digital code that define sufficient most-significant code words to designate respective segments of an inverse nonlinearity that is substantially the inverse of said converter nonlinearity and that, in response, multiplies the remaining least-significant bits of said digital code by digital multipliers which sufficiently modify said conversion gain to insert said inverse nonlinearity into said converter response.

20. The converter of claim 19, further including a digital adder in series with said digital multiplier wherein said controller responds to selected ones of said most-significant code words and commands said adder to sum digital offset words with said least-significant bits to thereby reduce any discontinuities introduced into said converter response by said multiplier.

21. An analog-to-digital converter, comprising:
   a plurality of successive converter stages that convert an analog signal to a digital code in a conversion process that progresses from upstream converter stages to downstream converter stages and produces a conversion response with a conversion nonlinearity;
   an analog-to-digital converter (ADC) in each of said converter stages that generates a digital-code portion of said digital code;
   a multiplying digital-to-analog converter (MDAC) in each of said converter stages that responds to the digital-code portion of its respective ADC and has a feedback capacitor and at least one sample capacitor that samples an input signal in a sample mode and, in response to said digital-code portion, transfers an amplifying charge to said feedback capacitor in an amplify mode;
   a digital multiplier that processes said digital code; and
   a digital controller that receives, from selected upstream converter stages, an upstream digital code which defines sufficient upstream code words to designate respective segments of an inverse nonlinearity that is substantially the inverse of said converter nonlinearity and that, in respective response to said upstream code words, commands said multiplier to multiply the downstream bits of said digital code that correspond to the remaining downstream converter stages by digital multipliers that adjust the conversion gain of said downstream stages to thereby insert said inverse nonlinearity into said converter response.

22. The converter of claim 21, further including a digital adder in series with said digital multiplier wherein said controller responds to selected ones of said upstream code words and commands said adder to sum digital offset words with said downstream bits to thereby reduce any discontinuities introduced into said converter response by said altering step.

23. An analog-to-digital converter, comprising:
   a plurality of successive converter stages that convert an analog signal to a digital code in a conversion process that progresses from upstream converter stages to downstream converter stages and produces a conversion response with a conversion nonlinearity;
   an analog-to-digital converter (ADC) in each of said converter stages that generates a digital-code portion of said digital code;
   a multiplying digital-to-analog converter (MDAC) in each of said converter stages that receives the digital-code portion of its respective ADC and has a feedback capacitor and at least one sample capacitor that samples an input signal in a sample mode and, in response to said digital-code portion, transfers an amplifying charge to said feedback capacitor in an amplify mode; and a controller that receives, from selected upstream converter stages, an upstream digital code which defines sufficient upstream code words to designate respective segments of an inverse nonlinearity that is substantially the inverse of said converter nonlinearity and that, in respective response to said upstream code words, sufficiently adjusts the conversion gain of the remaining downstream converter stages to insert said inverse nonlinearity into said converter response.

24. The converter of claim 23, wherein said controller alters the amplifying charge in the remaining downstream converter stages to thereby adjust the conversion gain of the remaining downstream converter stages.

25. The converter of claim 24, wherein said amplifying charge is transferred by a reference voltage applied to said sample capacitor and said controller provides an altering voltage that supplements said reference voltage.

26. The converter of claim 25, wherein said downstream converter stages include comparators that make conversion decisions with respect to a reference voltage and said controller supplements said reference voltage with an altering voltage.

27. The converter of claim 24, wherein said controller alters the gain of the immediate upstream converter stage that immediately precedes the remaining downstream converter stages thereby adjust the conversion gain of the remaining downstream converter stages.

28. The converter of claim 27, wherein said feedback capacitor and said sample capacitor each comprise pluralities of unit capacitors and said controller alters the number of unit capacitors that form said feedback capacitor and said sample capacitor.

29. The converter of claim 24, wherein said controller responds to selected ones of said upstream code words and modifies the amplifying charge in the immediate upstream converter stage that immediately precedes said remaining downstream converter stages to thereby reduce any discontinuities introduced into said converter response by the conversion gain adjustment.

30. The converter of claim 29, wherein said controller applies an offset voltage to the sample capacitor in said immediate upstream converter stage to thereby modify the amplifying charge.

31. The converter of claim 29, wherein the MDAC in said immediate upstream converter stage includes an offset capacitor coupled to said feedback capacitor and said controller applies an offset voltage to said offset capacitor.

32. The converter of claim 24, wherein each MDAC of said remaining downstream converter stages has an altering capacitor coupled to said feedback capacitor and said controller couples an altering voltage to said altering capacitor to thereby alter said amplifying charge.

* * * * *